United States Patent
Eliash et al.

(10) Patent No.: US 10,725,705 B1
(45) Date of Patent: Jul. 28, 2020

(54) SYSTEM AND METHOD FOR STORAGE SYSTEM PROPERTY DEVIATION

(71) Applicant: Western Digital Technologies, Inc., San Jose, CA (US)

(72) Inventors: Tomer Eliash, Kfar Saba (IL); Ofer Privman, Ra'anana (IL); Yuval Grossman, Kiryat Ono (IL); Jonathan Sokolowski, Yehud (IL); Alexander Bazarsky, Holon (IL); Judah Gamliel Hahn, Ofra (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/249,522

(22) Filed: Jan. 16, 2019

(51) Int. Cl.
*G06F 3/06* (2006.01)
*G06F 12/02* (2006.01)

(52) U.S. Cl.
CPC .......... *G06F 3/0659* (2013.01); *G06F 3/0604* (2013.01); *G06F 3/0613* (2013.01); *G06F 3/0614* (2013.01); *G06F 3/0679* (2013.01); *G06F 12/0246* (2013.01)

(58) Field of Classification Search
None
See application file for complete search history.

(56) References Cited

U.S. PATENT DOCUMENTS

| 8,281,061 | B2 * | 10/2012 | Radke ................ G11C 11/5628 711/103 |
| 9,135,190 | B1 | 9/2015 | Bruce et al. |
| 9,977,628 | B2 | 5/2018 | Kochar et al. |
| 2009/0077410 | A1 | 3/2009 | Lin et al. |
| 2009/0077436 | A1 | 3/2009 | Lo et al. |
| 2009/0276570 | A1 | 11/2009 | Cheng et al. |
| 2011/0167186 | A1 | 7/2011 | Elhamias et al. |
| 2011/0208896 | A1 * | 8/2011 | Wakrat ................ G06F 12/0246 711/103 |
| 2013/0128671 | A1 * | 5/2013 | Shin ...................... G11C 16/10 365/185.18 |
| 2013/0268726 | A1 * | 10/2013 | Guo ..................... G06F 12/0246 711/103 |
| 2014/0059277 | A1 * | 2/2014 | Chung .................. G06F 3/0604 711/103 |

(Continued)

FOREIGN PATENT DOCUMENTS

WO    WO 2015/185002 A1    12/2015

OTHER PUBLICATIONS

International Search Report completed Feb. 26, 2020 for International Application No. PCT/US2019/063241.

(Continued)

*Primary Examiner* — Kaushikkumar M Patel
(74) *Attorney, Agent, or Firm* — Brinks Gilson & Lione (57) ABSTRACT

A system and method for storage system property deviation are provided. In one embodiment, a storage system is presented comprising a memory and a controller configured to: receive a request from a host to modify a write parameter used to write data to the memory; write data to the memory using the modified write parameter; restore the write parameter to its pre-modified state; and re-write the data to the memory in a background operation using the write parameter in its pre-modified state. Other embodiments are provided.

19 Claims, 8 Drawing Sheets

(56) References Cited

U.S. PATENT DOCUMENTS

| | | |
|---|---|---|
| 2016/0092122 A1* | 3/2016 | Agrawal ............... G06F 3/0616 |
| | | 711/103 |
| 2016/0179428 A1* | 6/2016 | Parker .................... G11C 16/12 |
| | | 711/103 |
| 2016/0291883 A1 | 10/2016 | Manohar et al. |
| 2017/0031612 A1* | 2/2017 | Ravimohan ........... G06F 3/0619 |
| 2017/0040055 A1* | 2/2017 | Fujii ........................ G11C 11/56 |
| 2017/0115884 A1* | 4/2017 | Bhalerao ............... G06F 3/0604 |
| 2018/0081594 A1* | 3/2018 | Jung ..................... G11C 7/1084 |
| 2019/0042130 A1* | 2/2019 | Vittal Prabhu ....... G06F 3/0679 |

OTHER PUBLICATIONS

Written Opinion of the International Searching Authority completed Feb. 26, 2020 for International Application No. PCT/US2019/063241.

\* cited by examiner

SYSTEM AND METHOD FOR STORAGE SYSTEM PROPERTY DEVIATION

BACKGROUND

Throughput, endurance, and data retention are factors that are often considered in memory design. Since a memory system can be used in many use cases, the system is often designed to provide acceptable throughput, endurance, and data retention for common use cases. While there may be variations between different manufacturers, all storage systems in a given manufacturer's product line usually have the same throughput, endurance, and data retention specifications.

DETAILED DESCRIPTION

By way of introduction, the below embodiments relate to a system and method for storage system property deviation. In one embodiment, a storage system is presented comprising a memory and a controller configured to: receive a request from a host to modify a write parameter used to write data to the memory; write data to the memory using the modified write parameter; restore the write parameter to its pre-modified state; and re-write the data to the memory in a background operation using the write parameter in its pre-modified state.

In some embodiments, the data is marked so it can be identified as being written using the modified write parameter.

In some embodiments, the modified write parameter improves at least one of throughput, endurance, and data retention at an expense of another one or more of throughput, endurance, and data retention.

In some embodiments, the request comprises a selection of one of a pre-determined number of different write parameters.

In some embodiments, the request comprises a requirement, and wherein the controller is further configured to modify the write parameter to satisfy the requirement.

In some embodiments, the memory comprises a three-dimensional memory.

In some embodiments, the storage system is removably connectable to the host.

In some embodiments, the storage system is embedded in the host.

In another embodiment, a method for storage system property deviation is presented that is performed in a storage system comprising a memory. The method comprises altering a write parameter used to write data to the memory; writing data to the memory using the altered write parameter; and re-writing the data to the memory using the write parameter in its original state.

In some embodiments, the data is re-written in a background operation.

In some embodiments, the method further comprises receiving a request from a host to alter the write parameter.

In some embodiments, the request comprises a selection of one of a pre-determined number of different write parameters.

In some embodiments, the method further comprises marking the data so it can be identified as being written using the altered write parameter.

In some embodiments, the altered write parameter improves at least one of throughput, endurance, and data retention at an expense of another one or more of throughput, endurance, and data retention.

In some embodiments, the memory comprises a three-dimensional memory.

In another embodiment, a storage system is provided comprising a memory; means for writing data to the memory using a modified write parameter; and means for re-writing the data to the memory using the write parameter in its pre-modified state.

In some embodiments, the storage system further comprises means for marking the data so it can be identified as being written using the modified write parameter.

In some embodiments, the data is re-written in a background operation.

In some embodiments, the memory comprises a three-dimensional memory.

In some embodiments, the storage system is embedded in a host.

Other embodiments are possible, and each of the embodiments can be used alone or together in combination. Accordingly, various embodiments will now be described with reference to the attached drawings.

Figures 1A, 1B:
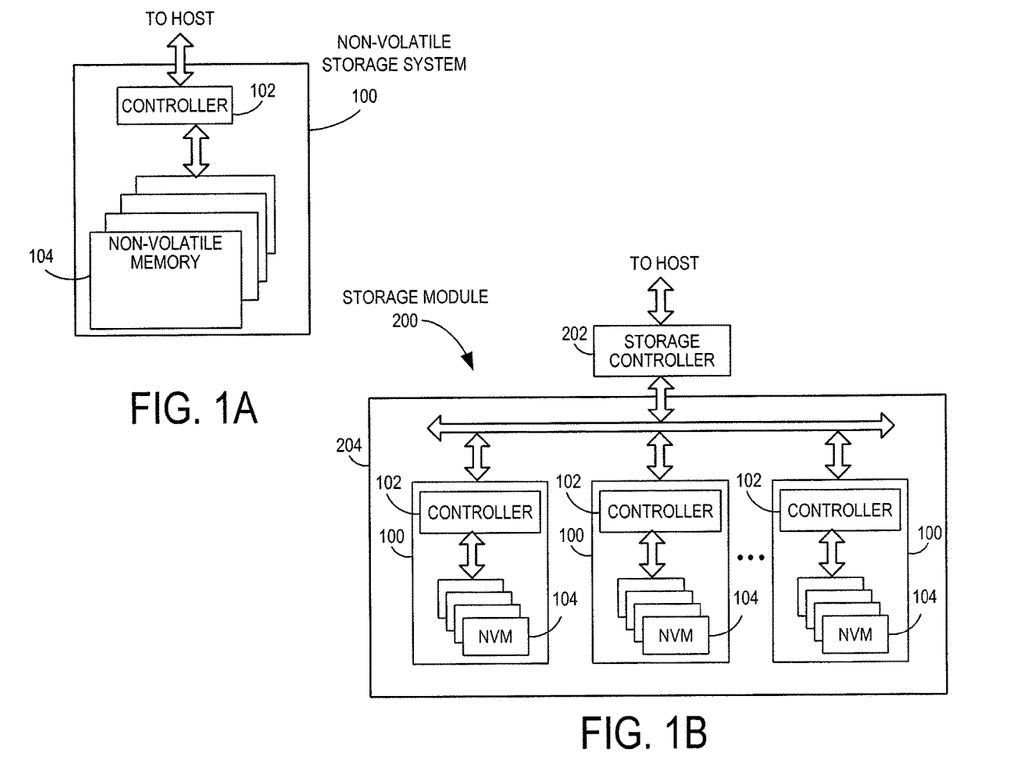
FIG. 1A is a block diagram of a non-volatile storage system of an embodiment.
FIG. 1B is a block diagram illustrating a storage module of an embodiment.
Figure 1C:
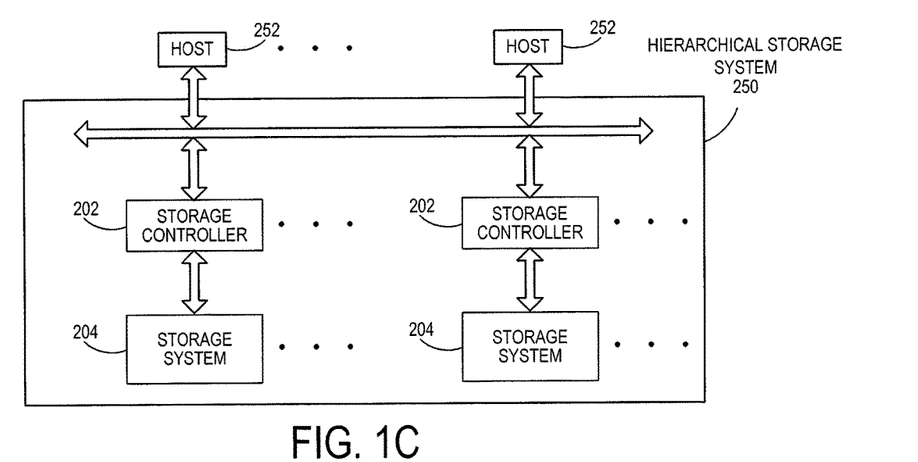
FIG. 1C is a block diagram illustrating a hierarchical storage system of an embodiment.

Turning now to the drawing, storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. (The terms "memory" and "media" may be used interchangeably herein.) Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interconnect express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
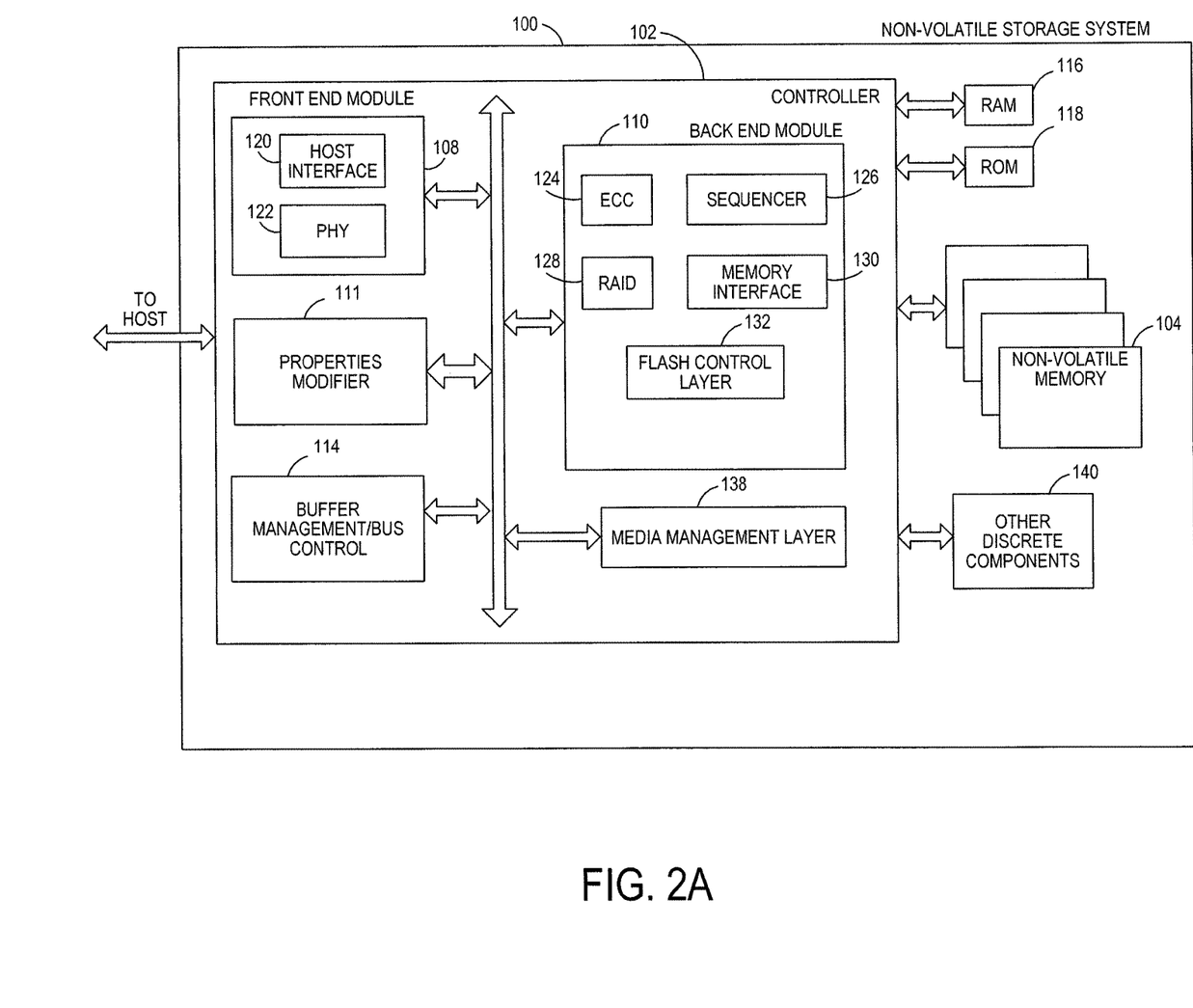
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. For example, in this embodiment, the controller 102 comprises a properties modifier 111, which will be discussed in more detail below. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, Serial Attached SCSI (SAS), Fibre Channel, Universal Serial Bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
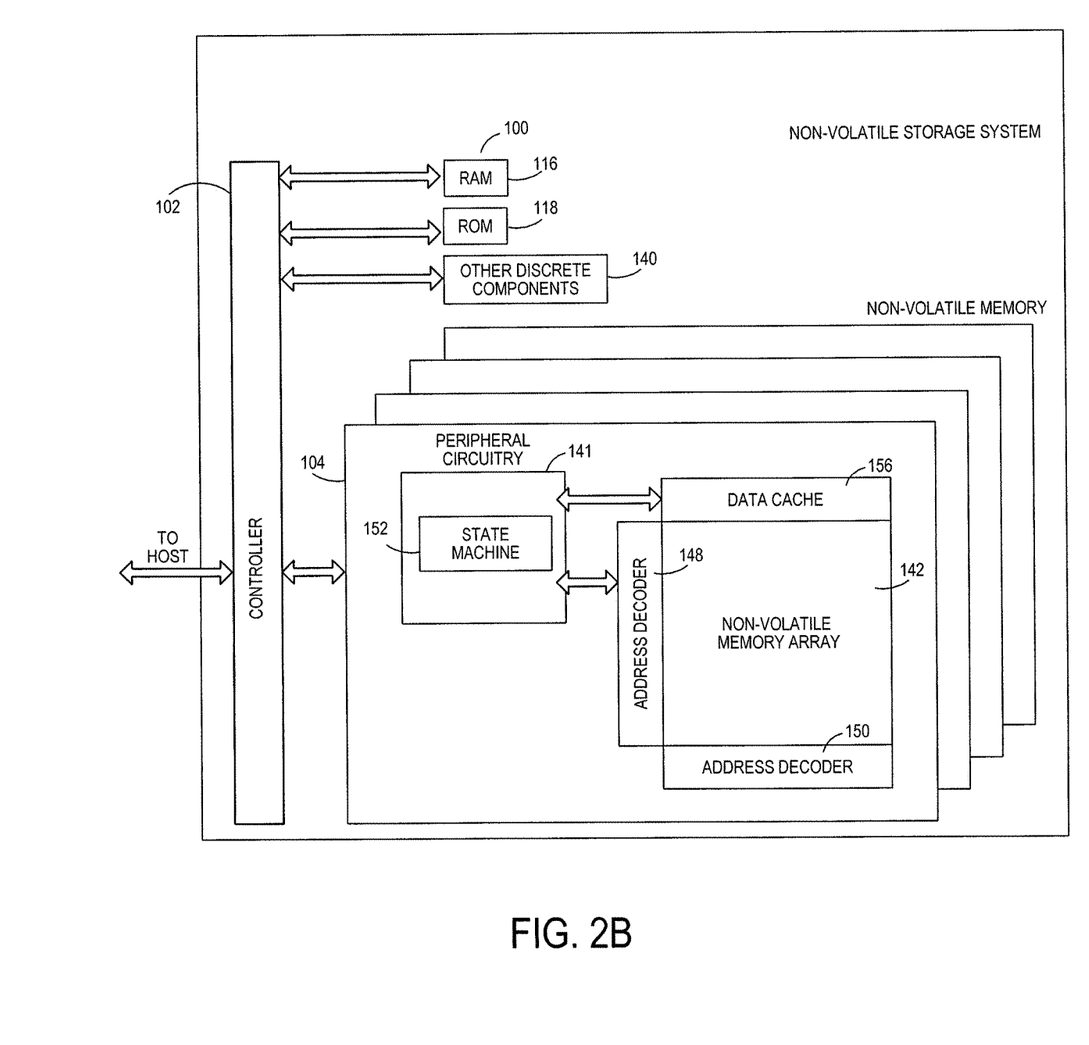
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data.

Storage systems (sometimes referred to herein as storage devices or just devices) are often required to withstand certain conditions, according to host specifications. These conditions include throughput, quality of service (QoS), endurance, data retention (DR), and others. These requirements are often generic and do not apply to many of users. For example, a gamer who uses the storage device often and replaces his entire computer every few years would have little use of the device's data retention withstanding capabilities. In turn, he may prefer faster response time, better throughput, and QoS. However, when the device is designed, its properties (e.g., read parameters and/or write parameters) are designed to withstand all conditions, without caveats. This requirement forces the device designers to impose certain limitations that may not apply to all users. In practice, many of the devices in the field do not realize their full potential in view of the individual consumer's needs.

Figure 3:
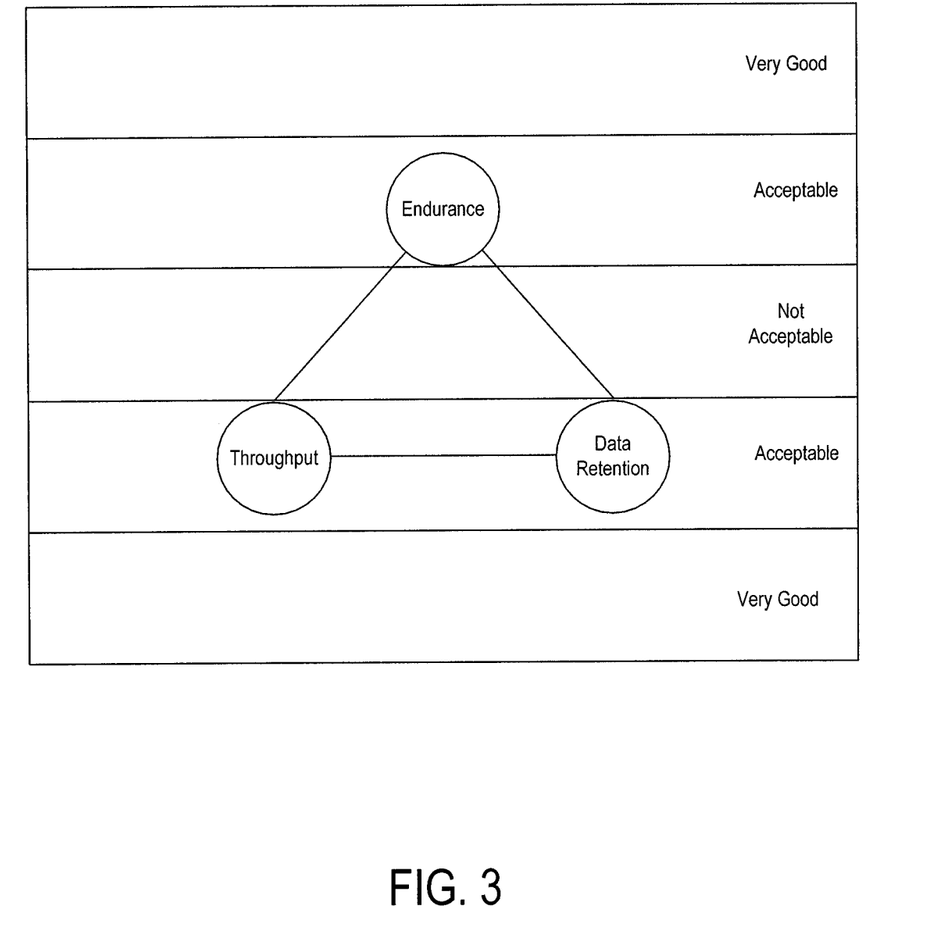
FIG. 3 is an illustration showing the relationship among endurance, throughput, and data retention of an embodiment.

Flash memory design often imposes a three-way trade-off between major factors, as shown in FIG. 3. These factors are throughput, endurance, and data retention. Improving the device in one of these aspects (improving throughput, increasing the program/erase (P/E) cycles the device can withstand, and increasing the period (or temperature) without power the device can withstand) adversely affects the other two aspects. In FIG. 3, these design aspects are shown along with the standard requirement fulfillment rates: very good, acceptable, and not acceptable. Previously, the generic requirements were satisfied by all devices that belong to the same product line, sometimes differing by original equipment manufacturing (OEM)-specific requirements. There was no option to modify properties during a single device's lifetime by compromising other properties. The below embodiments present a way to (temporarily or permanently) affect this relationship and improve one of the factors at the expense of the other two (or just one of them).

In one embodiment, the storage system 100 allows modification of its properties after its design, and a host can (temporarily or permanently) improve one of the device's properties at the expense of (temporarily or permanently) potentially impairing other properties. The idea is based on the fact that many users do not utilize some of the OEM requirements regarding data retention or endurance, while centering on throughput. These users may be gamers that require fast device response time or financial applications using temporary data. Other users may prefer to store data in a "vault mode," which allows longer data retention while writing the data slowly, at the expense of write performance.

Figure 4:
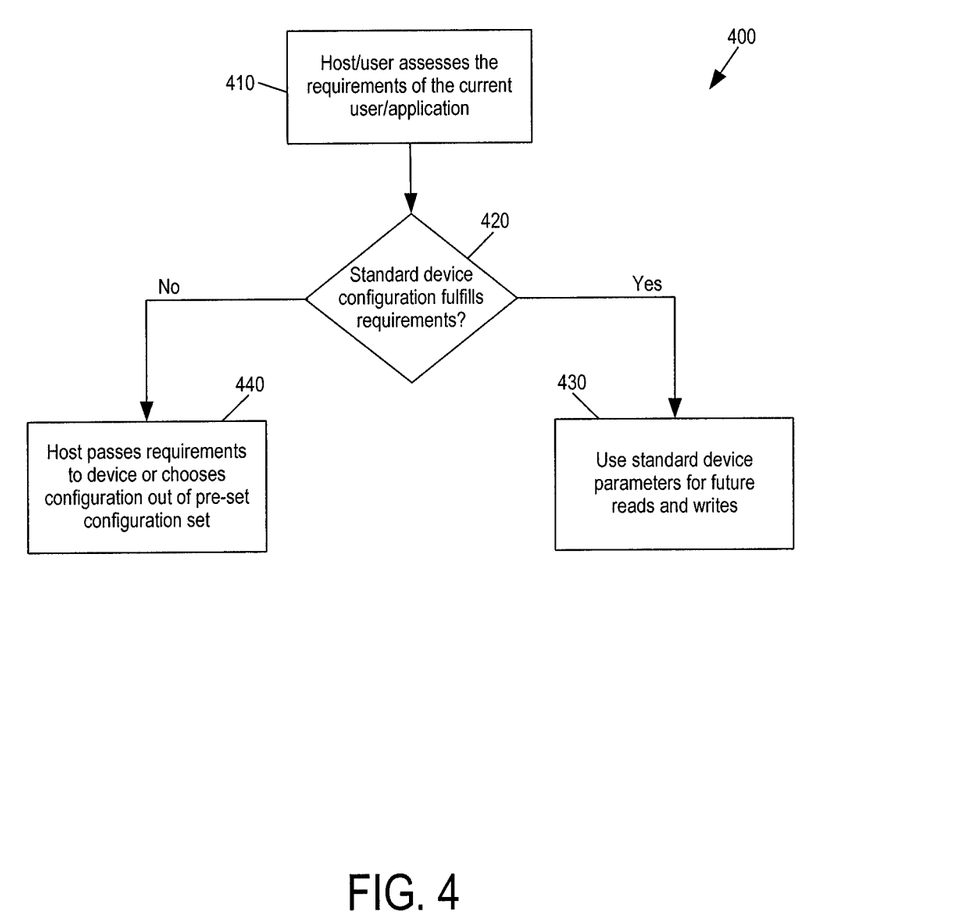
FIG. 4 is a flow chart of a method of an embodiment for host-controlled storage system property deviation.

Turning again to the drawings, FIG. 4 is a flow chart 400 of a method of an embodiment for host-controlled storage system property deviation. As shown in FIG. 4, the host (or the user) assesses the requirements of the current application with respect to its performance, endurance, and data retention (act 410). Next, the host decides whether the requirements are fulfilled using the standard device configuration (act 420). If the requirements are fulfilled, the standard device configuration employing the standard device properties are used (act 430). Otherwise, the host may supply additional device requirement through some protocol to adapt standard device configuration (act 440). The custom device configuration may be either determined by the device or picked (by either device or host) from a pre-set number of different configurations. In one embodiment, the controller 102 (e.g., the properties modifier 111) takes the input and modifies the properties accordingly.

The following paragraphs provide two uses cases as example implementations of these embodiments.

The first use case relates to a "gaming mode," where it is desired to have high performance at the expense of endurance and/or data retention. In many cases, storage devices are used to store data for a short time, rather than use long term storage. Personal computers (PCs) are usually replaced after several years, and new mobile devices released by vendors every year replace the old models regularly. On the other hand, many consumers need better performance (throughput) to improve frame rate while gaming, shoot longer movies, shoot more pictures, and so on. In this environment, this embodiment can provide users with the hardware they need, customizing it to their needs.

Figure 5:
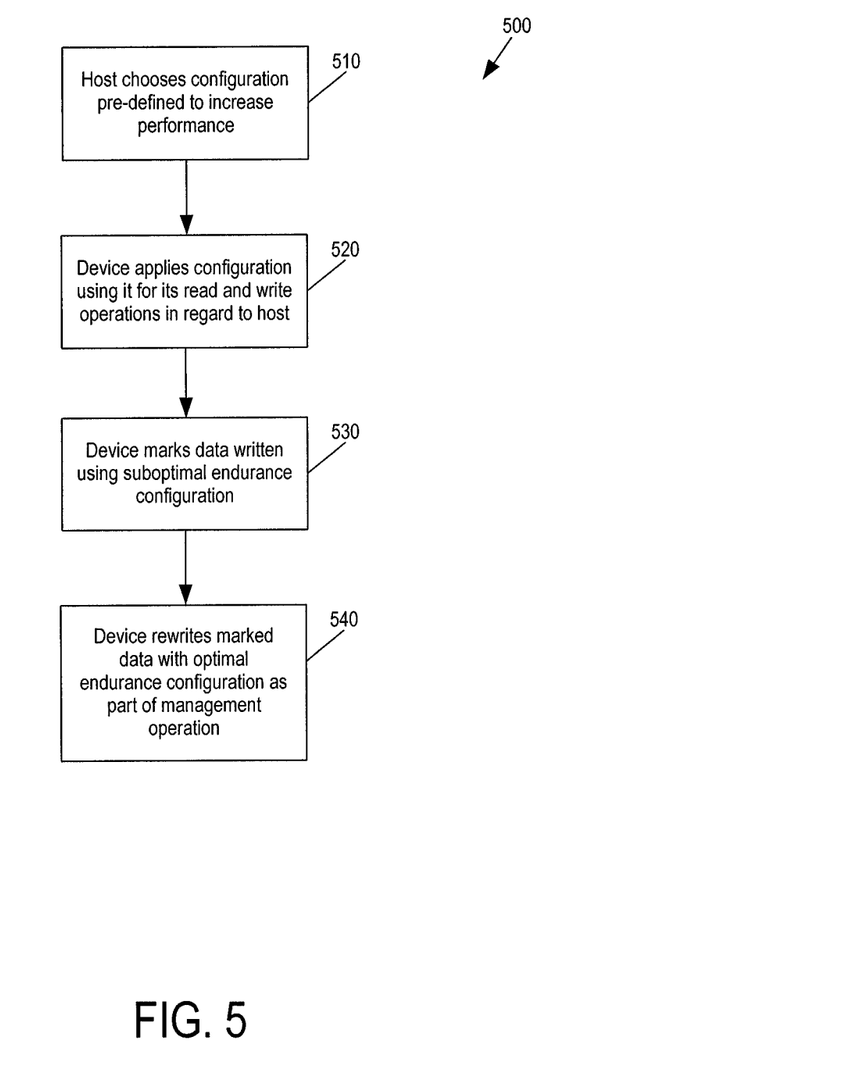
FIG. 5 is a flow chart of a method of an embodiment where a host chooses a configuration designed to optimize performance at the expense of endurance and data retention resistance.
Figure 6:
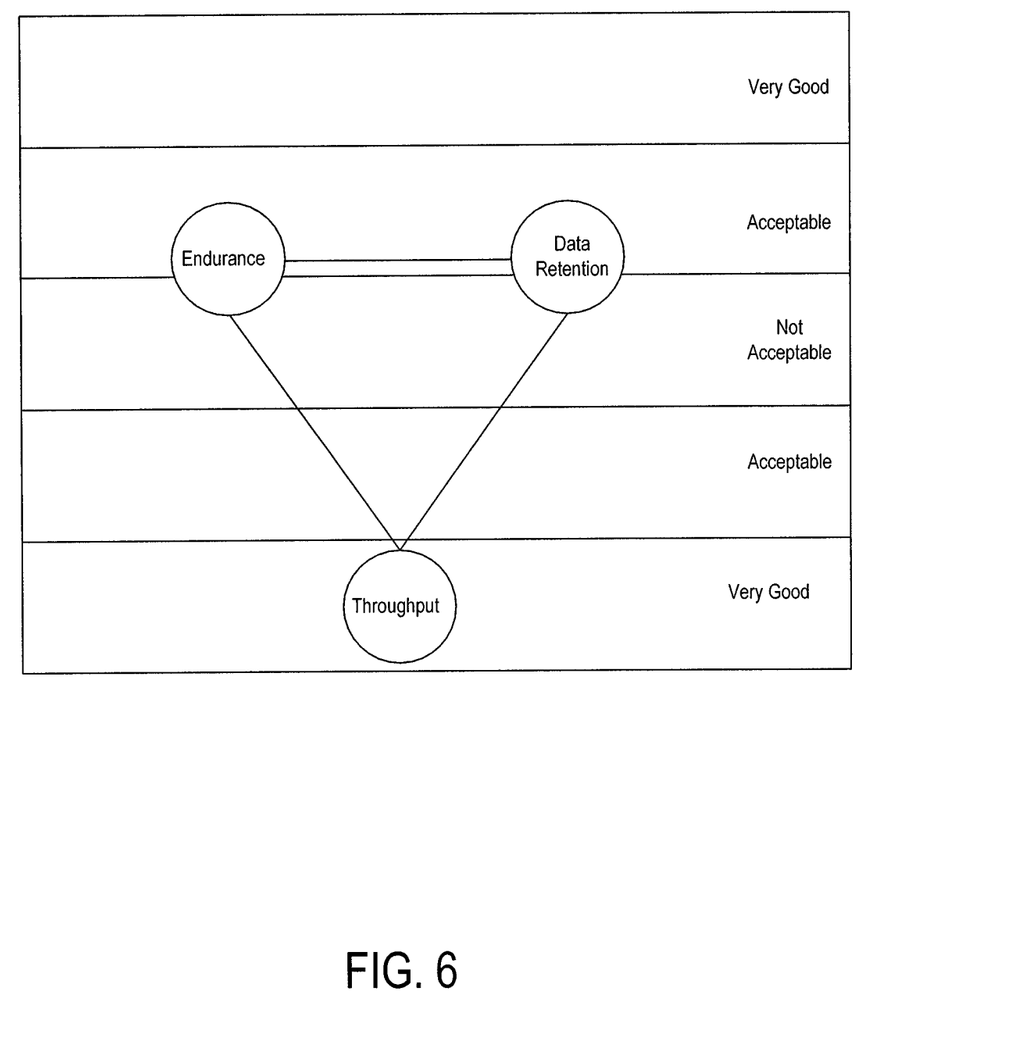
FIG. 6 is an illustration showing the relationship among endurance, throughput, and data retention of an embodiment.

FIG. 5 is a flow chart 500 of a method of an embodiment where a host chooses a configuration designed to optimize performance at the expense of endurance and data retention resistance, and FIG. 6 visualizes the modifications made to the properties using this method. Turning first to FIG. 5, the host chooses a configuration that was pre-defined to increase performance, according to its current needs (act 510). Next, the storage device 100 applies the configuration to the subsequent host requests, such as write and read (act 520). For example, the configuration (i.e., the write parameter) may apply to the verification strength and the voltage window of the write operation (verify pulse number and voltage window size are in inverse relation to bit error rate (BER)). It may also apply the configuration to different management operations and set its schedule accordingly.

If the configuration the host selected impaired endurance and data retention significantly, it may be of use to replace the data once the host finished its high performance phase. More specifically, the device 100 can mark data written using a suboptimal configuration (act 530) and then re-write the marked data with an optimal endurance configuration as part of the management (background) operation (act 540).

FIG. 6 shows that, by using this embodiment, the throughput has moved to the very good zone, while endurance and data retention are impaired—shown in the acceptable/not-acceptable zones.

Turning now to the second use case, it may be desired to use the storage system 100 in a "vault mode," which allows high data retention at the expense of performance and endurance. In this use case, the storage system 100 is used to store data for a long time rather than used for short-term storage. For example, the storage system 100 may be disconnected from a power source and even kept in a physical vault. Advanced external storage devices already have solid state drives (SSDs) inside, and this trend is expected to expand.

Figure 7:
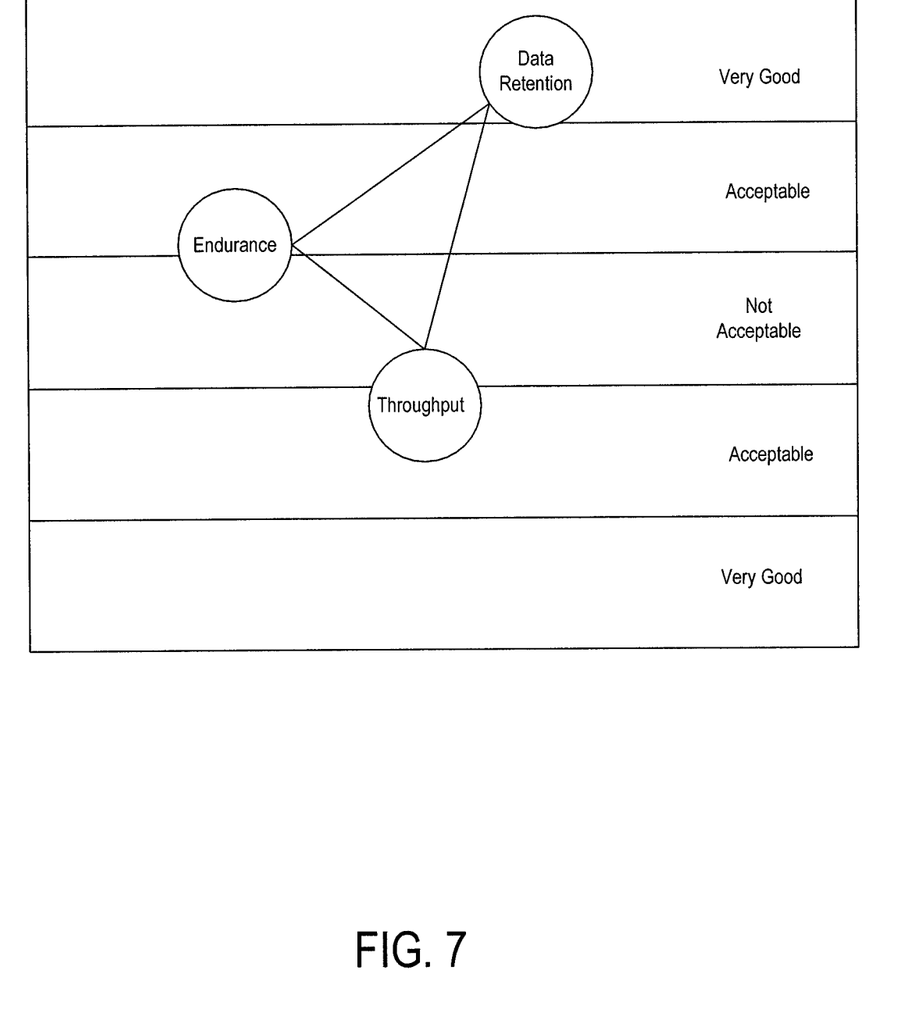
FIG. 7 is an illustration showing the relationship among endurance, throughput, and data retention of an embodiment

In this mode of storage, there is no use for standard storage demands, such as throughput or endurance (number of P/E cycles), but it is desired to store the data for a long time, requiring good data retention resistance. In such a use case, the host may select a write configuration that prefers a large number of programming and verify pulses and also a larger voltage window. The storage system 100 may also write the data several times, which impairs device endurance and write throughput but improves data retention resistance. FIG. 7 visualizes the modification made to the properties. One can see that data retention resistance is improved at the expense of throughput and endurance.

There are several advantages associated with these embodiments. For example, these embodiments can allow better utilization of a storage device's properties. Users that do not require some of the device's properties can be given an option to suit their needs exactly and, by this, gain other improved properties.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
a memory; and
a controller configured to:
receive a request from a host to modify a write parameter used to write data to the memory to increase at least one of throughput, endurance, and data retention at an expense of decreasing another one or more of throughput, endurance, and data retention;
write data to the memory using the modified write parameter;
determine if the another one or more of throughput, endurance, and data retention decreases below a threshold;
in response to determining that the another one or more of throughput, endurance, and data retention decreases below the threshold, mark the data as being written using the modified write parameter;
restore the write parameter to its pre-modified state;
search for the mark to identify the data; and
re-write the data to the memory in a background operation using the write parameter in its pre-modified state.

2. The storage system of claim 1, wherein the request comprises a selection of one of a pre-determined number of different write parameters.

3. The storage system of claim 1, wherein:
the request comprises a requirement; and
the controller is further configured to modify the write parameter to satisfy the requirement.

4. The storage system of claim 1, wherein the memory comprises a three-dimensional memory.

5. The storage system of claim 1, wherein the storage system is removably connectable to the host.

6. The storage system of claim 1, wherein the storage system is embedded in the host.

7. A method for storage system property deviation, the method comprising:
performing the following in a storage system comprising a memory:
altering a write parameter used to write data to the memory to increase at least one of throughput, endurance, and data retention at an expense of decreasing another one or more of throughput, endurance, and data retention;
writing data to the memory using the altered write parameter;
determining if the another one or more of throughput, endurance, and data retention decreases below a threshold;
in response to determining that the another one or more of throughput, endurance, and data retention decreases below the threshold, marking the data as being written using the altered write parameter; and
re-writing the marked data to the memory using the write parameter in its original state.

8. The method of claim 7, wherein the marked data is re-written in a background operation.

9. The method of claim 7, further comprising receiving a request from a host to alter the write parameter.

10. The method of claim 9, wherein the request comprises a selection of one of a pre-determined number of different write parameters.

11. The method of claim 9, wherein the request comprises a requirement, and wherein the method further comprises modifying the write parameter to satisfy the requirement.

12. The method of claim 7, wherein the memory comprises a three-dimensional memory.

13. The method of claim 7, wherein the storage system is removably connectable to a host.

14. A storage system comprising:
a memory;
means for writing data to the memory using a modified write parameter to increase at least one of throughput, endurance, and data retention at an expense of decreasing another one or more of throughput, endurance, and data retention;
means for determining if the another one or more of throughput, endurance, and data retention decreases below a threshold;
means for, in response to determining that the another one or more of throughput, endurance, and data retention decreases below the threshold, marking the data as being written using the modified write parameter; and
means for re-writing the marked data to the memory using the write parameter in its pre-modified state.

15. The storage system of claim 14, wherein the marked data is re-written in a background operation.

16. The storage system of claim 14, wherein the memory comprises a three-dimensional memory.

17. The storage system of claim 14, wherein the storage system is embedded in a host.

18. The storage system of claim 14, further comprising means for receiving a request from a host to modify the write parameter.

19. The storage system of claim 18, wherein the request comprises a requirement, and wherein the storage system further comprises means for modifying the write parameter to satisfy the requirement.

* * * * *